United States Patent
Hoya

(10) Patent No.: US 9,348,697 B2
(45) Date of Patent: May 24, 2016

(54) MAGNETIC RANDOM ACCESS MEMORY

(71) Applicant: KABUSHIKI KAISHA TOSHIBA, Minato-ku, Tokyo (JP)

(72) Inventor: Katsuhiko Hoya, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 85 days.

(21) Appl. No.: 14/196,689

(22) Filed: Mar. 4, 2014

(65) Prior Publication Data

US 2015/0074491 A1    Mar. 12, 2015

Related U.S. Application Data

(60) Provisional application No. 61/876,085, filed on Sep. 10, 2013.

(51) Int. Cl.
| | | |
|---|---|---|
| *G11C 29/00* | (2006.01) | |
| *G06F 11/10* | (2006.01) | |
| *H03M 13/05* | (2006.01) | |
| *G11B 20/18* | (2006.01) | |

(52) U.S. Cl.
CPC ............ *G06F 11/1076* (2013.01); *G06F 11/10* (2013.01); *G11B 20/1803* (2013.01); *G11B 20/1833* (2013.01); *H03M 13/05* (2013.01)

(58) Field of Classification Search
CPC ... G06F 11/10; G06F 11/106; G06F 11/1096; H03M 13/05
USPC .......................................................... 714/764
See application file for complete search history.

(56) References Cited

U.S. PATENT DOCUMENTS

| | | | |
|---|---|---|---|
| 5,621,743 A | | 4/1997 | Tomisawa |
| 6,584,589 B1 * | | 6/2003 | Tran et al. ..................... 714/721 |
| 6,704,230 B1 | | 3/2004 | DeBrosse et al. |
| 9,112,536 B2 | | 8/2015 | Alam |
| 9,170,879 B2 * | | 10/2015 | Yang ..................... G06F 11/106 |
| 2003/0093744 A1 * | | 5/2003 | Leung et al. .................. 714/763 |
| 2004/0219740 A1 | | 11/2004 | Nishihara |
| 2005/0193164 A1 | | 9/2005 | Royer, Jr. et al. |
| 2006/0282755 A1 | | 12/2006 | Oh |
| 2008/0133994 A1 * | | 6/2008 | Oh ................................ 714/746 |
| 2008/0288809 A1 | | 11/2008 | Koguchi et al. |
| 2009/0100315 A1 | | 4/2009 | Lee |
| 2009/0168571 A1 * | | 7/2009 | Pyo et al. ...................... 365/200 |

(Continued)

OTHER PUBLICATIONS

Yu, et al., "A Hybrid ECC and Redundancy Technique for Reducing Refresh Power of DRAMs", 2013 IEEE 31st VLSI Test Symposium (VTS).

*Primary Examiner* — David Ton
(74) *Attorney, Agent, or Firm* — Holtz, Holtz & Volek PC

(57) ABSTRACT

According to one embodiment, a magnetic random access memory includes memory cells, a read circuit, (ECC) circuit, an address register, a flag register, a flag check circuit, and a write back circuit. The memory cells each include a magnetoresistive element. The address register stores the address at which the error has been detected by the ECC circuit. The data register stores corrected data in which the error has been corrected by the ECC circuit. The flag register sets an error flag in association with the address at which the error has been detected by the ECC circuit. The flag check circuit checks whether the error flag is set in the flag register. The write back circuit writes back the data to the memory cell designated by the address corresponding to the error flag.

7 Claims, 11 Drawing Sheets

(56) References Cited

U.S. PATENT DOCUMENTS

| | | |
|---|---|---|
| 2010/0088572 A1 | 4/2010 | Ohnuki et al. |
| 2010/0142260 A1* | 6/2010 | Yoon et al. .................... 365/158 |
| 2011/0041016 A1 | 2/2011 | O'Connell |
| 2012/0060066 A1 | 3/2012 | Nagadomi et al. |
| 2012/0268994 A1 | 10/2012 | Nagashima |
| 2014/0169083 A1 | 6/2014 | Wang et al. |
| 2014/0281810 A1* | 9/2014 | Gifford et al. ................ 714/764 |

* cited by examiner

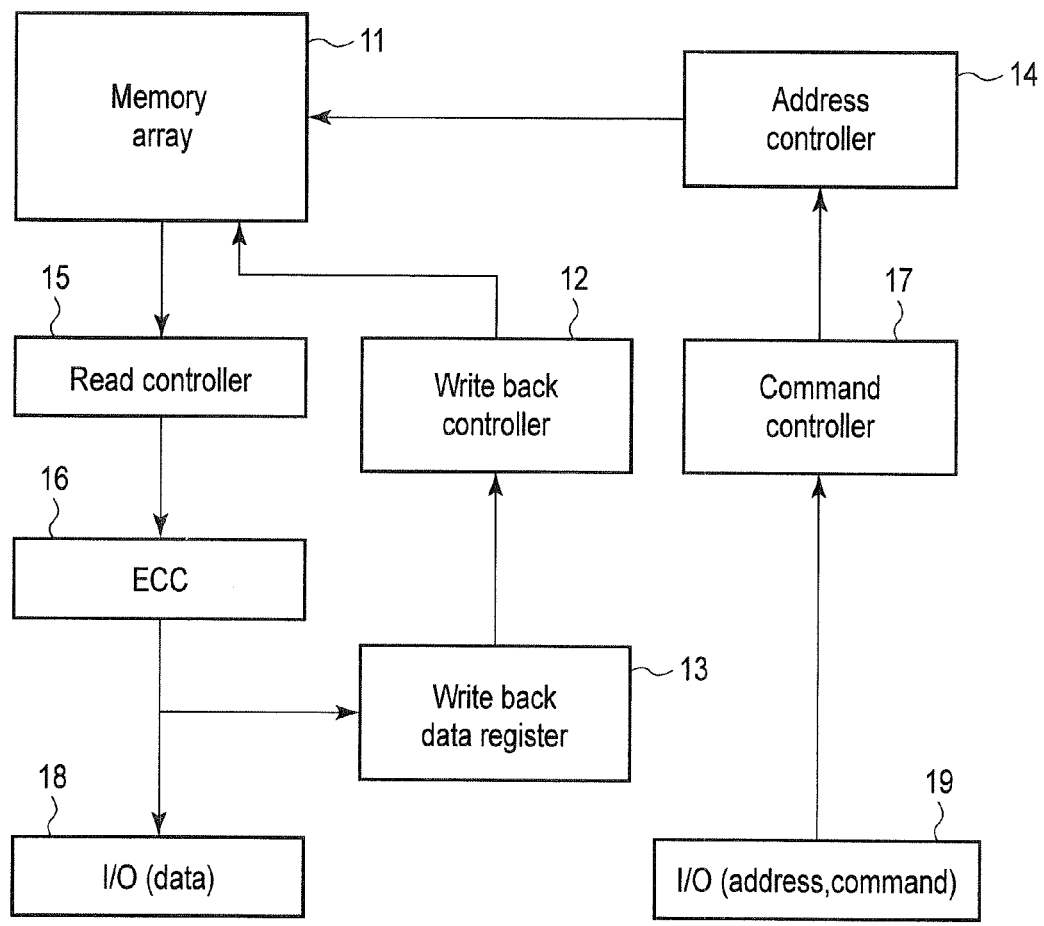
F I G. 1

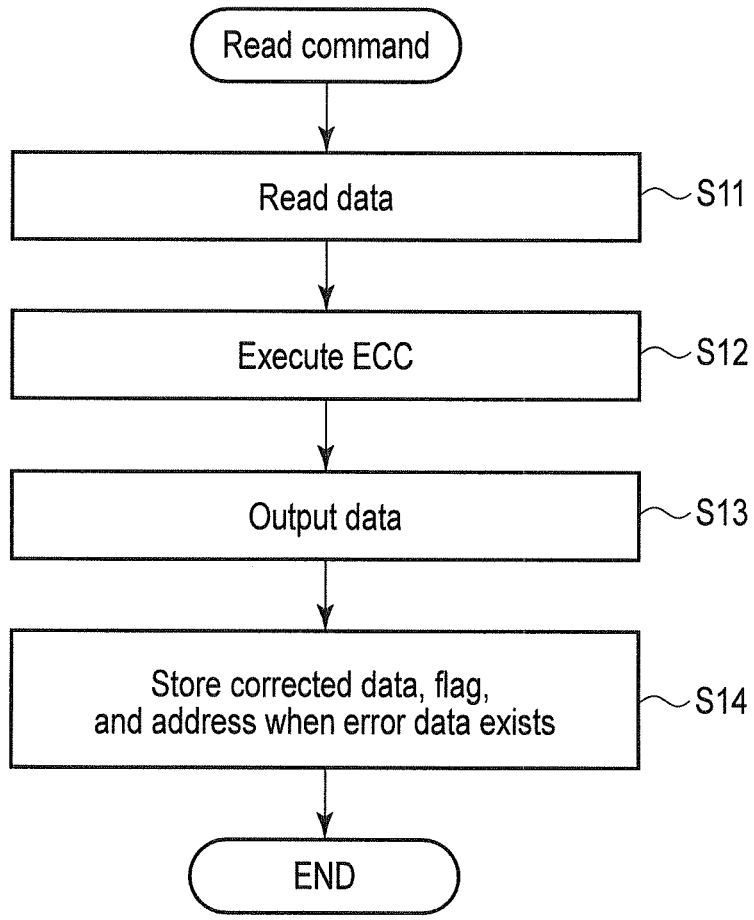
F I G. 5

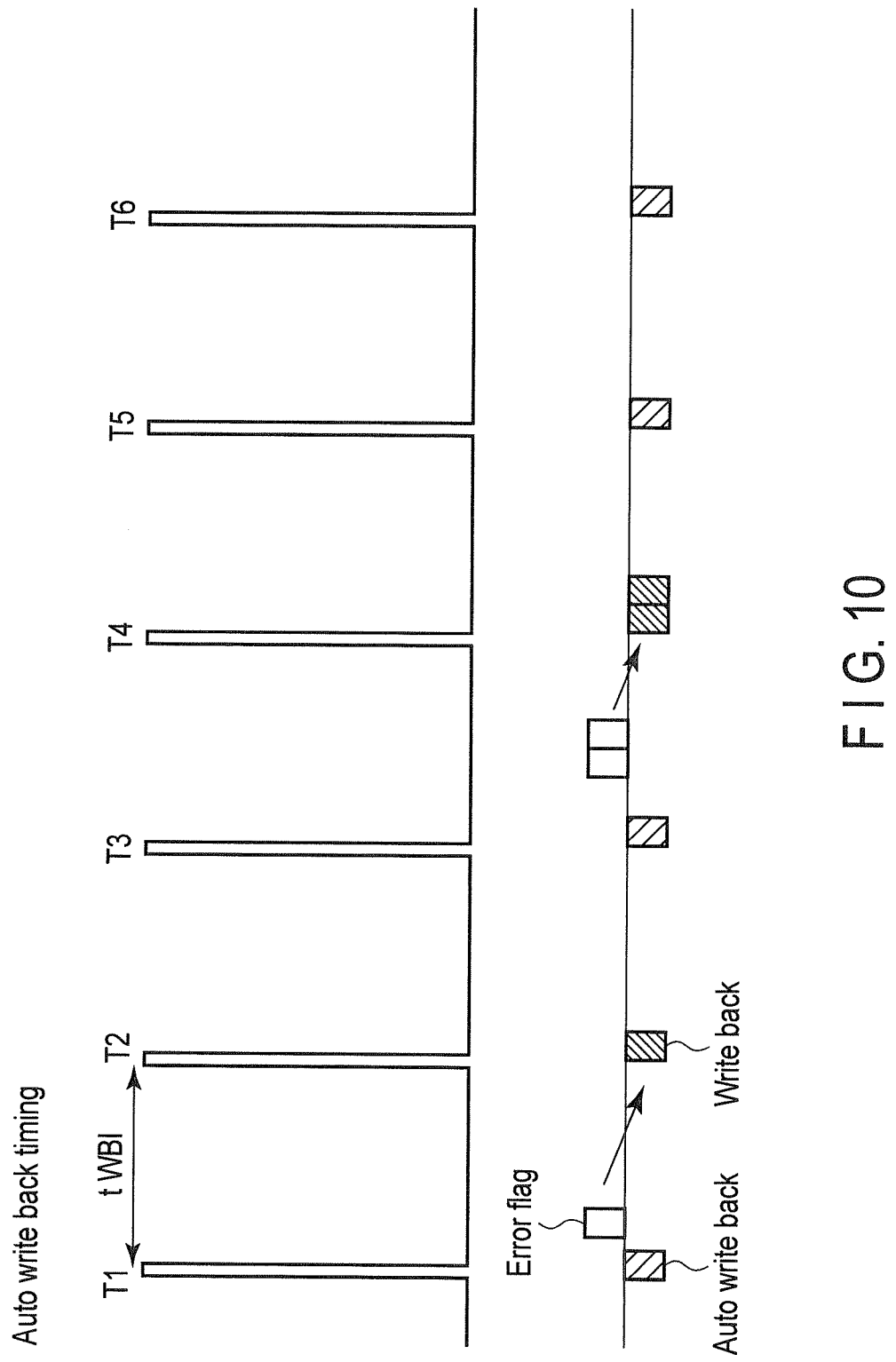
F I G. 10

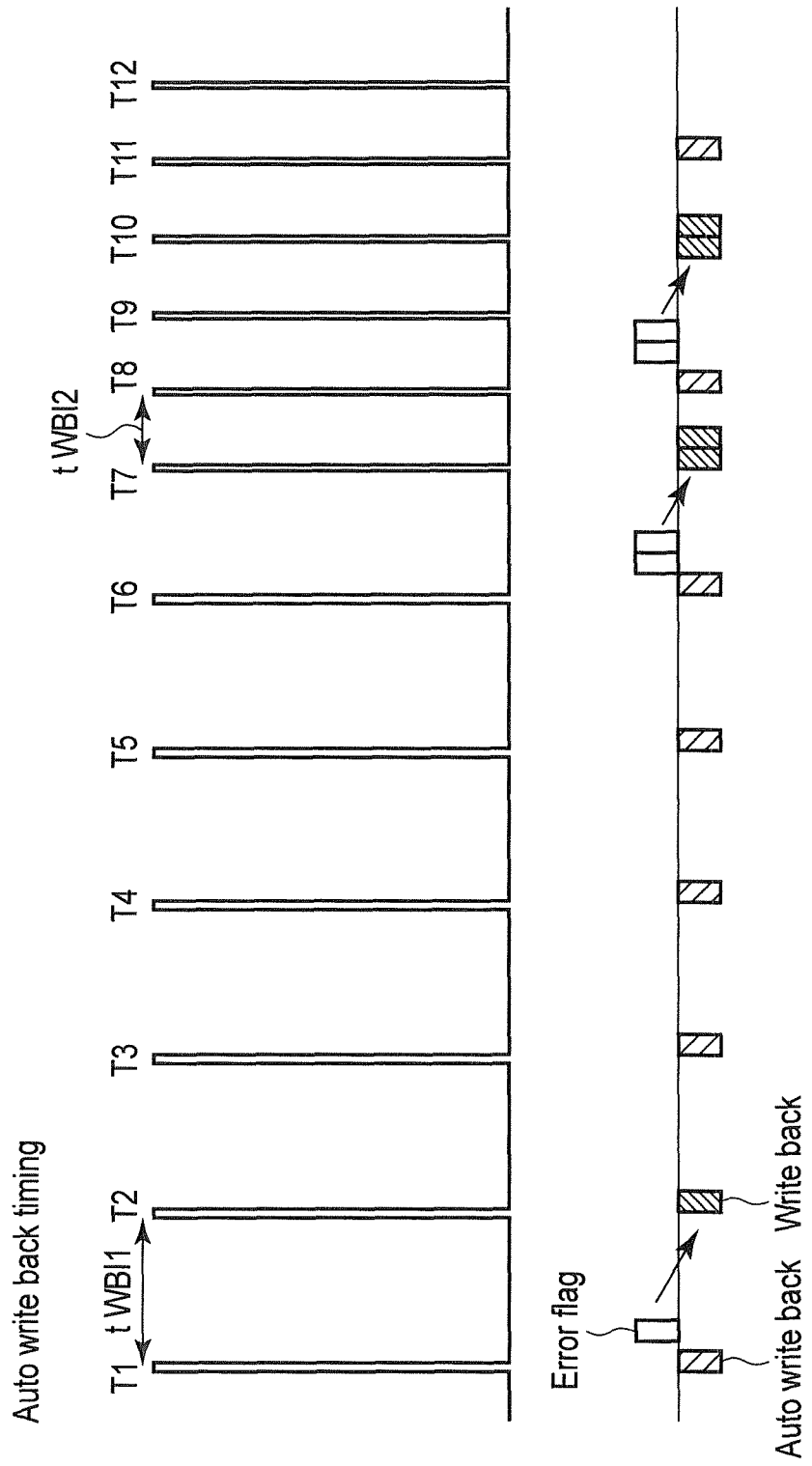
F I G. 12

MAGNETIC RANDOM ACCESS MEMORY

CROSS-REFERENCE TO RELATED APPLICATIONS

This application claims the benefit of U.S. Provisional Application No. 61/876,085, filed Sep. 10, 2013, the entire contents of which are incorporated herein by reference.

FIELD

Embodiments described herein relate generally to a magnetic random access memory.

BACKGROUND

Magnetic random access memories (to be referred to as MRAMs hereinafter) using the magnetoresistive effects of ferromagnetic materials have recently attracted interest as next-generation solid-state nonvolatile memories capable of speeding up read/write, increasing the capacity, and implementing a low-power operation. As the read method of the MRAMs, a method of feeding a current through a memory cell and reading data based on the magnitude of the value of the current that has flowed is used in general.

BRIEF DESCRIPTION OF THE DRAWING

FIG. 1 is a block diagram showing the arrangement of an MRAM according to a first embodiment;

FIG. 5 is a flowchart showing the read operation of the MRAM according to the second embodiment;

FIG. 10 is a timing chart showing an auto write back operation of the MRAM according to the third embodiment;

FIG. 12 is a timing chart showing an auto write back operation of the MRAM according to the modification of the third embodiment.

DETAILED DESCRIPTION

Figure 2:
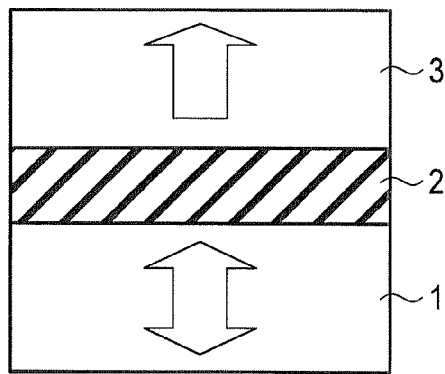
FIG. 2 is a sectional view of a magnetoresistive element included in a memory cell of the MRAM.

Embodiments will now be described with reference to the accompanying drawing. In the following explanation, the same reference numerals denote constituent elements having the same functions and arrangements, and a repetitive explanation will be made only when necessary. The embodiments to be described below merely exemplify devices and methods for embodying the technical concepts of the embodiments, and the materials, shapes, structures, layouts, and the like of the components are not limited to those to be described below.

In general, according to one embodiment, a magnetic random access memory includes a memory cell array, a read circuit, an error checking and correction (ECC) circuit, an address register, a data register, a flag register, a flag check circuit, and a write back circuit.

In the memory cell array, memory cells each including a magnetoresistive element are arranged. The read circuit reads data from a memory cell designated by an address out of the memory cells. The ECC circuit checks an error in the data read by the read circuit and corrects the error. The address register stores the address at which the error has been detected by the ECC circuit. The data register stores corrected data in which the error has been corrected by the ECC circuit. The flag register sets an error flag in association with the address at which the error has been detected by the ECC circuit. The flag check circuit checks whether the error flag is set in the flag register. The write back circuit writes back the data to the memory cell designated by the address corresponding to the error flag.

First Embodiment

In the first embodiment, an example will be described in which data is read from the memory cell array of a magnetic random access memory (MRAM), error checking and correction of the data is performed immediately after the read, and the data is written back to a memory cell at which an error has been detected.

FIG. 1 is a block diagram showing the arrangement of an MRAM according to the first embodiment.

As shown in FIG. 1, the MRAM includes a memory cell array 11, a write back controller 12, a write back data register 13, an address controller 14, a read controller 15, an error checking and correction (ECC) circuit 16, a command controller 17, and input/output circuits 18 and 19.

The memory cell array 11 includes a plurality of memory cells for storing data. Each memory cell includes a resistance change element and a select transistor. The resistance change element includes, for example, a magnetoresistive element. A magnetic tunnel junction (MTJ) element is used here as the magnetoresistive element. The select transistor is used to select the memory cell from the memory cell array 11.

FIG. 2 illustrates the sectional structure of the MTJ element included in the memory cell of the MRAM.

As shown in FIG. 2, the MTJ element includes a storage layer 1, a reference layer 3, and a tunnel barrier layer 2 arranged between the storage layer 1 and the reference layer 3.

The storage layer 1 is a magnetic layer having a variable magnetization direction, and has perpendicular magnetic anisotropy with a magnetization direction perpendicular or almost perpendicular to the film plane (upper surface/lower surface). "Variable magnetization direction" means that the magnetization direction changes with respect to the write current.

The tunnel barrier layer 2 is formed on the storage layer 1. The tunnel barrier layer 2 is a nonmagnetic layer and is made of, for example, MgO.

The reference layer 3 is formed on the tunnel barrier layer 2. The reference layer 3 is a magnetic layer having an invariable magnetization direction, and has perpendicular magnetic anisotropy with a magnetization direction perpendicular or almost perpendicular to the film plane. "Invariable magnetization direction" means that the magnetization direction does not change with respect to the write current. That is, the magnetization direction reversing energy barrier of the reference layer 3 is larger than that of the storage layer 1.

The read controller 15 controls data read from the memory cells in the memory cell array 11. The ECC circuit 16 performs error checking of the data read by the read controller 15 and corrects error data. The input/output circuit 18 outputs the data that has undergone the error checking and correction of the ECC circuit 16.

The write back data register 13 temporarily stores the data that has undergone the error checking and correction of the ECC circuit 16. The write back controller 12 writes back the data stored in the write back data register 13 to the memory cells.

The input/output circuit 19 receives a command and an address and outputs them to the command controller 17 and the address controller 14. The command controller 17 receives the command and performs control necessary for the operation of the command. The address controller 14 supplies the address to the memory cell array 11.

Figure 3:
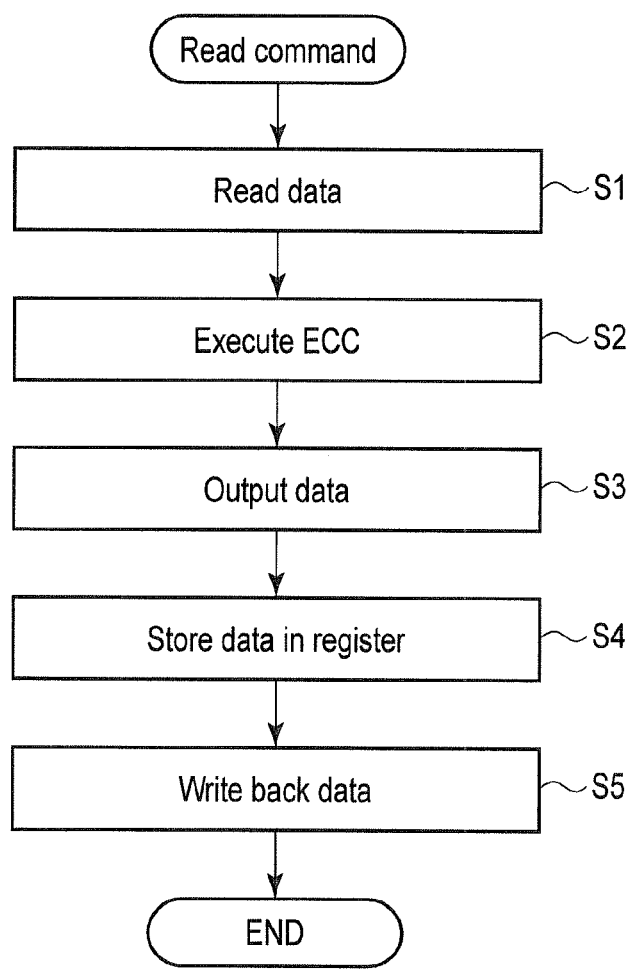
FIG. 3 is a flowchart showing the read operation of the MRAM according to the first embodiment.

The read operation of the MRAM according to the first embodiment will be described next with reference to FIG. 3. FIG. 3 is a flowchart showing the read operation of the MRAM.

When a read command and an address are input to the input/output circuit 19, the command controller 17 performs control necessary for read, and the address controller 14 outputs the read target address to the memory cell array 11.

Next, the read controller 15 reads data from the memory cell designated by the address (step S1). The ECC circuit 16 performs error checking of the read data, and if error data exists, corrects the error data (step S2). After that, the data processed by the ECC circuit 16 is output from the input/output circuit 18 (step S3).

In addition, the data processed by the ECC circuit 16 is stored in the write back data register 13 (step S4). If error data exists, the write back controller 12 writes back the data in the write back data register 13 to the memory cell from which the error data has been read (step S5). The operation of the read command thus ends.

As the read method of, for example, the magnetic random access memory (MRAM), a method of feeding a current through a memory cell and reading data based on the magnitude of the value of the current that has flowed is used currently. As the generations have passed, a current Ic necessary to invert the value of a memory cell is scaled down. Depending on the decrease in the current Ic, a current Iread needed to read the data of a memory cell is also scaled down. However, the current Iread cannot have a value equal to or smaller than the minimum current value necessary for read. For this reason, the decrease amount of the current Iread is smaller than that of the current Ic, and concerns are rising that read data may erroneously be inverted due to read disturb that occurs at the time of read.

To solve the above-described problem, the first embodiment includes the above-described arrangement and operation. That is, data is read from the memory cell array 11, and error checking and correction of the read data is performed. Immediately after the error checking and correction, the data is written back to the address (memory cell) at which error data has been detected. This makes it possible to reduce data errors caused by read disturb and write errors.

Second Embodiment

In the second embodiment, an example will be described in which at the time of read when a read command is input, if read data includes an error, an error flag is set, and the address and corrected data are stored. An auto write back command is input for every predetermined period, and the corrected data is written back to the address for which the error flag is set.

Figure 4:
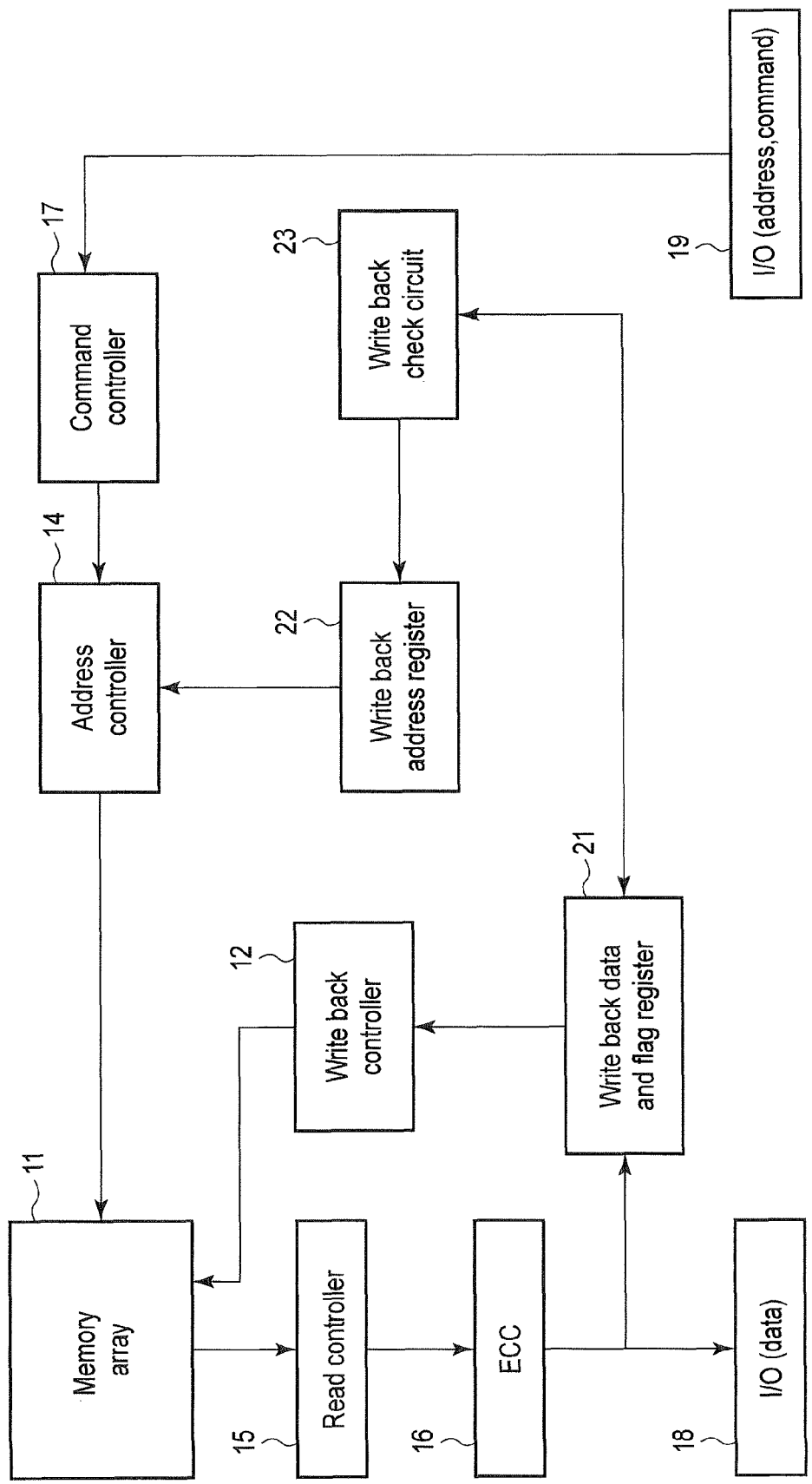
FIG. 4 is a block diagram showing the arrangement of an MRAM according to a second embodiment.

FIG. 4 is a block diagram showing the arrangement of an MRAM according to the second embodiment.

As shown in FIG. 4, the MRAM includes a memory cell array 11, a write back controller 12, a write back data and flag register 21, an address controller 14, a write back address register 22, a write back check circuit 23, a command controller 17, a read controller 15, an ECC circuit 16, and input/output circuits 18 and 19.

The write back data and flag register 21 temporarily stores data that has undergone error checking and correction of the ECC circuit 16, and sets an error flag in association with an address at which an error has been detected. The write back address register 22 temporarily stores the address at which the error has been detected by the ECC circuit 16.

The write back check circuit 23 detects whether an error flag is set in the write back data and flag register 21, and outputs the detection result to the write back address register 22. The rest of the arrangement is the same as in the first embodiment.

Read executed in the second embodiment and auto write back performed after the read will be described next.

FIG. 5 is a flowchart showing the read operation of the MRAM.

When a read command and an address are input to the input/output circuit 19, the command controller 17 performs control necessary for read, and the address controller 14 outputs the read target address to the memory cell array 11.

Next, the read controller 15 reads data from the memory cell designated by the address (step S11). The ECC circuit 16 performs error checking of the read data, and if error data exists, corrects the error data (step S12). After that, the data processed by the ECC circuit 16 is output from the input/output circuit 18 (step S13).

In addition, the data processed by the ECC circuit 16 is stored in the write back data and flag register 21. An error flag associated with the address at which the error has been detected by the ECC circuit 16 is set in the write back data and flag register 21. The address at which the error has been detected by the ECC circuit 16 is stored in the write back address register 22 (step S14). The operation of the read command thus ends.

After the above-described read, an auto write back command is input for every predetermined period.

Figure 6:
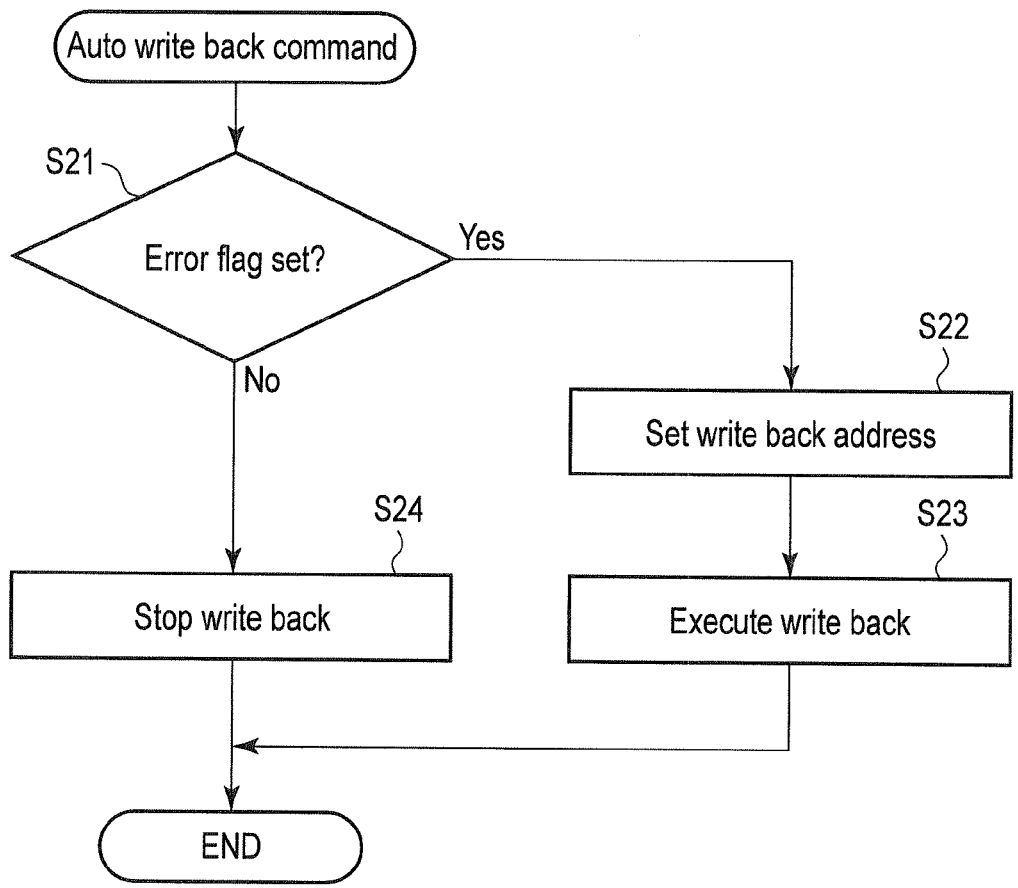
FIG. 6 is a flowchart showing the operation of an auto write back command of the MRAM according to the second embodiment.

FIG. 6 is a flowchart showing the operation of the auto write back command of the MRAM.

When the auto write back command is input to the input/output circuit 19, the command controller 17 performs control necessary for auto write back.

First, the write back check circuit 23 determines whether an error flag is set in the write back data and flag register 21 (step S21). If an error flag is set, the address corresponding to the error flag, which is stored in the write back address register 22, is output to the address controller 14.

Write back is executed to the memory cell designated by the address set in the address controller 14. That is, data in the write back data and flag register 21 corresponding to the address is written back to the memory cell of the address by the write back controller 12 (step S23).

On the other hand, if no error flag is set in step S21, the write back stops, and the operation ends (step S24).

Figure 7:
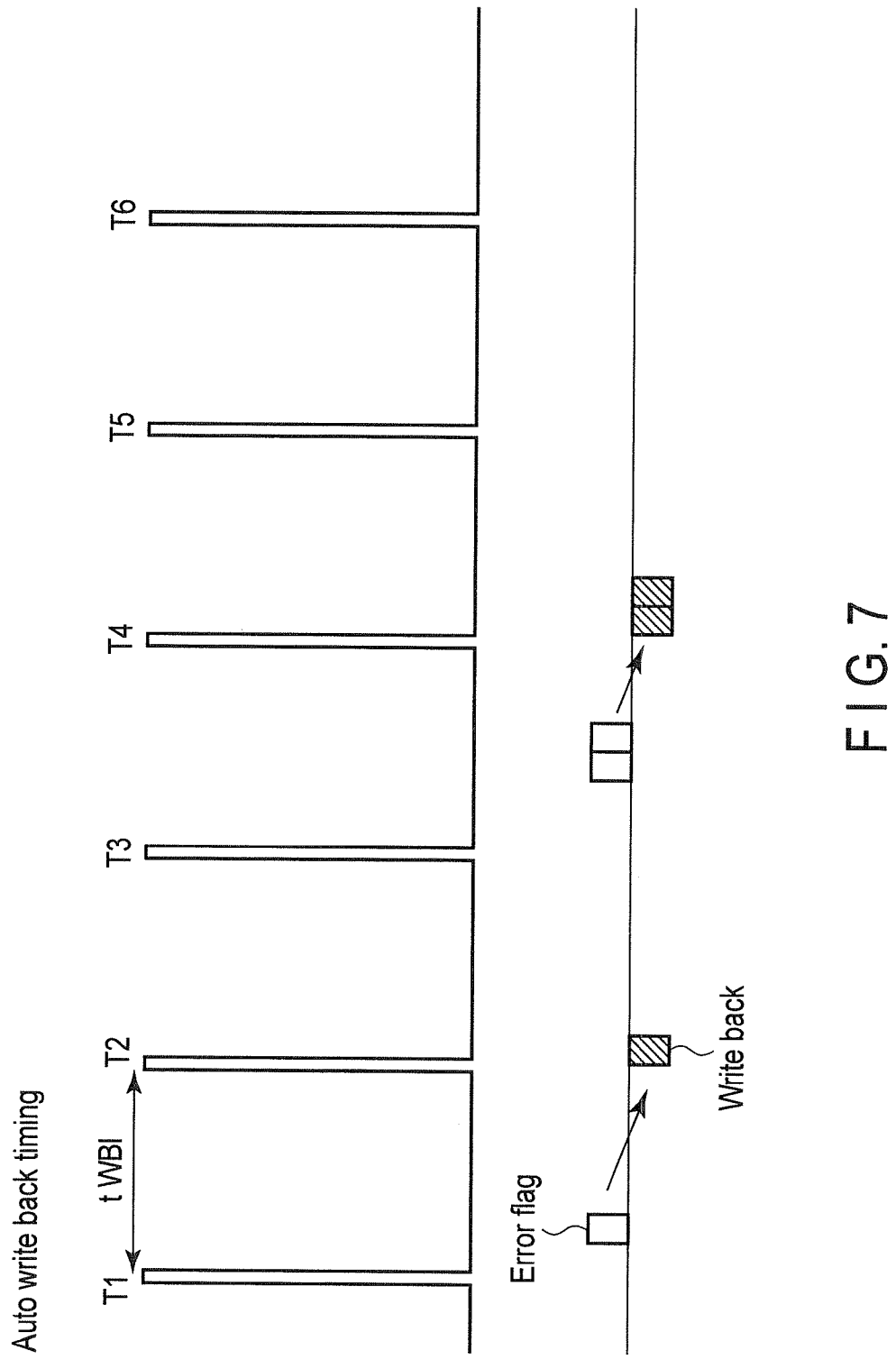
FIG. 7 is a timing chart showing an auto write back operation of the MRAM according to the second embodiment.

The auto write back operation of the MRAM according to the second embodiment will be described in detail with reference to FIG. 7. FIG. 7 is a timing chart showing the auto write back operation of the MRAM. Assume that the auto write back command is input periodically at each of times T1 to T6.

As shown in FIG. 7, the auto write back command is input every time a time tWBI has elapsed, that is, at each of the times T1 to T6. When the auto write back command is input at the time T1, the write back check circuit 23 checks whether an error flag is set in the write back data and flag register 21.

In this case, since an error flag is set, the write back controller 12 writes back corrected data corresponding to the error flag to an address corresponding to the error flag at the time T2 at which the next auto write back command is input.

At the time T2, it is checked whether an error flag is set in the write back data and flag register 21. In this case, since no error flag is set, write back is not performed at the time T3 at which the next auto write back command is input.

At the time T3, it is checked whether an error flag is set in the write back data and flag register 21. In this case, two error flags are set. Hence, the write back controller 12 writes back corrected data corresponding to the error flags to addresses corresponding to the error flags at the time T4 at which the next auto write back command is input.

At the time T4 and the times T5 and T6 at which the next auto write back command is input, it is checked whether an error flag is set in the write back data and flag register 21. In this case, since no error flag is set, write back is not performed.

In the second embodiment, error checking and correction of read data is performed at the time of read when a read command is input. If the read data includes an error, an error flag is set, and the address and corrected data are stored. The error flag is checked for every predetermined period. If an error flag is set, the corrected data is written back to the address for which the error flag is set. Data write back is performed not immediately after read by the read command but for every predetermined period. This can shorten the read cycle time in the read operation. It is also possible to reduce data errors caused by read disturb and write errors. The chip size can also be reduced.

Third Embodiment

In the third embodiment, an example will be described in which when an error flag is set, write back is performed, and when no error flag is set, auto write back is performed. That is, in the second embodiment, write back is performed only when an error flag is set. In the third embodiment, when an error flag is set, write back is performed similarly. However, when no error flag is set, auto write back is performed.

Figure 8:
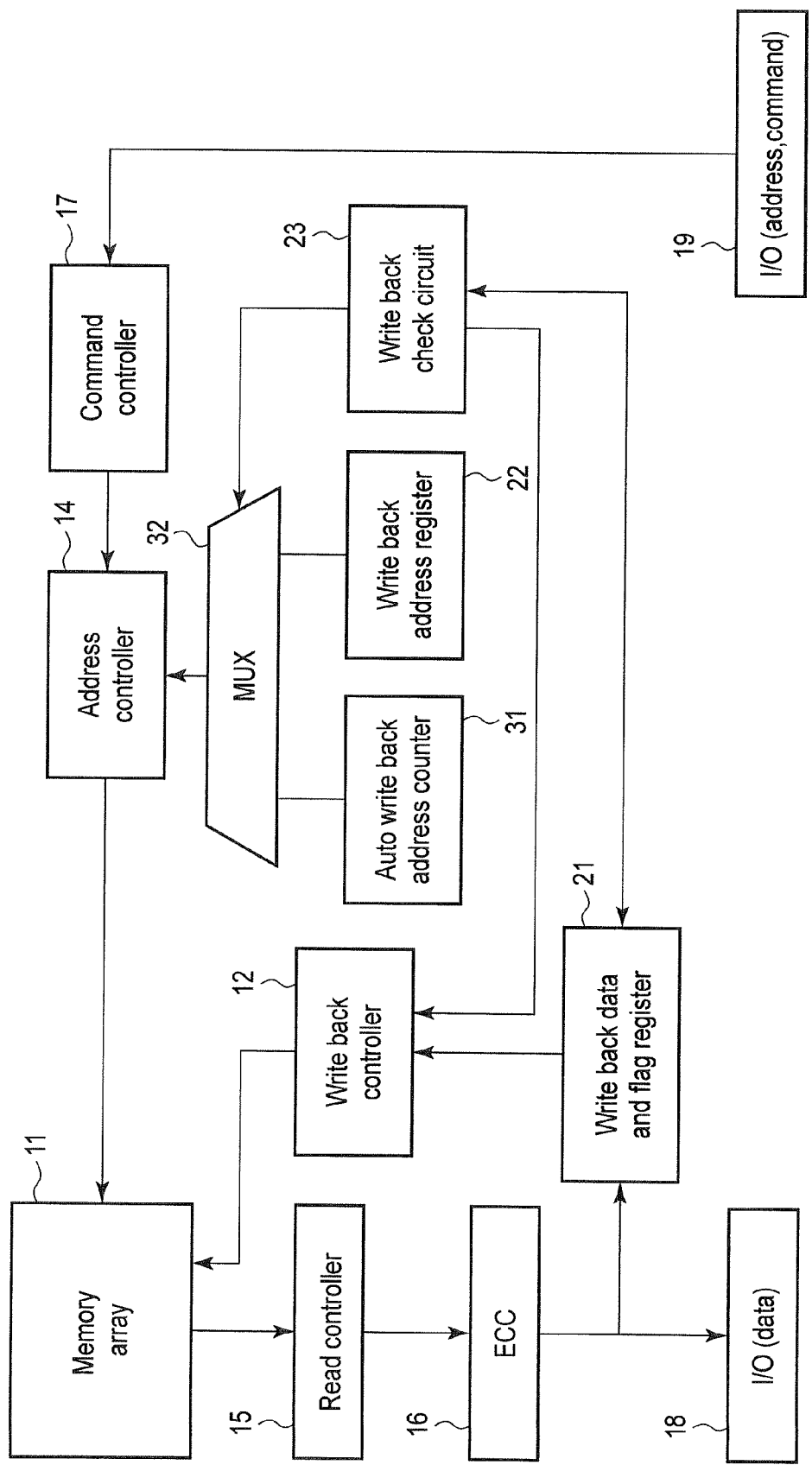
FIG. 8 is a block diagram showing the arrangement of an MRAM according to a third embodiment.

FIG. 8 is a block diagram showing the arrangement of an MRAM according to the third embodiment.

As shown in FIG. 8, the MRAM includes a memory cell array 11, a write back controller 12, a write back data and flag register 21, an address controller 14, a write back address register 22, a write back check circuit 23, an auto write back address counter 31, a multiplexer 32, a command controller 17, a read controller 15, an ECC circuit 16, and input/output circuits 18 and 19.

The auto write back address counter 31 automatically generates an address for write back under predetermined control and increments the address. The multiplexer 32 selects one of the outputs of the write back address register 22 and the auto write back address counter 31 in accordance with the error flag detection result output from the write back check circuit 23, and supplies the output to the address controller 14. The rest of the arrangement is the same as in the second embodiment.

In the third embodiment, storing an error flag and its address and corrected data corresponding to it at the time of read when a read command is input is the same as in the second embodiment, and a description thereof will be omitted.

Figure 9:
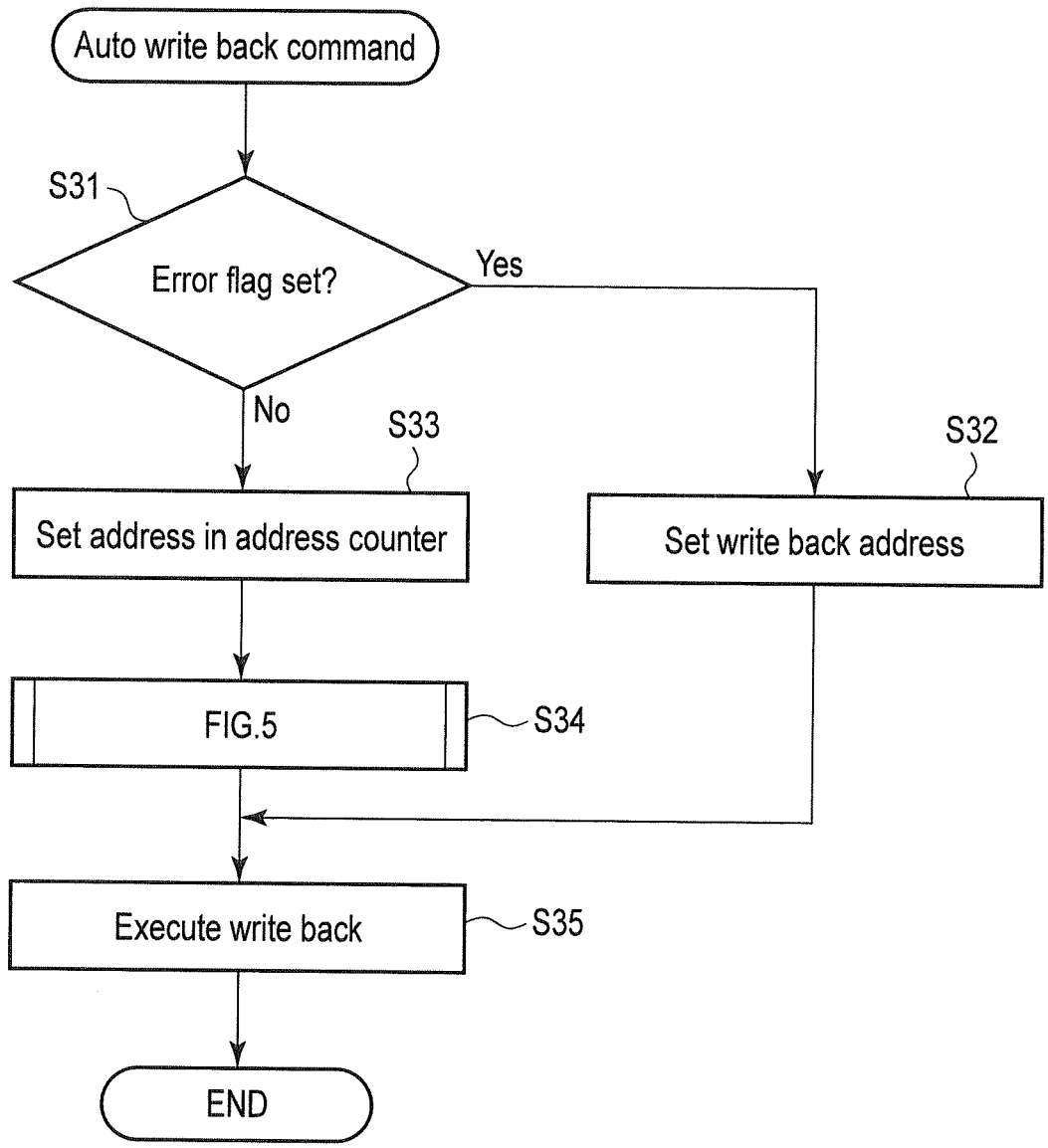
FIG. 9 is a flowchart showing the operation of an auto write back command of the MRAM according to the third embodiment.

FIG. 9 is a flowchart showing the operation of the auto write back command of the MRAM according to the third embodiment.

When the auto write back command is input to the input/output circuit 19, the command controller 17 performs control necessary for auto write back.

First, the write back check circuit 23 determines whether an error flag is set in the write back data and flag register 21 (step S31). If an error flag is set, the multiplexer 32 outputs the address corresponding to the error flag, which is stored in the write back address register 22, to the address controller 14.

Write back is executed to the memory cell designated by the address set in the address controller 14. That is, data in the write back data and flag register 21 corresponding to the address is written back to the memory cell of the address by the write back controller 12 (step S35).

On the other hand, if no error flag is set in step S31, the multiplexer 32 outputs the address stored in the auto write back address counter 31 to the address controller 14 (step S33).

Next, read shown in FIG. 5 is executed for the address set in the address controller 14 (step S34). If the ECC circuit 16 detects an error in the read, the address at which the error has been detected is stored in the write back address register 22. In addition, the address is output from the write back address register 22 to the address controller 14 via the multiplexer 32. Furthermore, write back is executed to the memory cell designated by the address set in the address controller 14. The operation of the auto write back command thus ends.

The auto write back operation of the MRAM according to the third embodiment will be described in detail with reference to FIG. 10. FIG. 10 is a timing chart showing the auto write back operation of the MRAM. Assume that the auto write back command is input periodically at each of times T1 to T6.

As shown in FIG. 10, the auto write back command is input every time a time tWBI has elapsed, that is, at each of the times T1 to T6. When the auto write back command is input at the time T1, the write back controller 12 executes auto write back. In addition, the write back check circuit 23 checks whether an error flag is set in the write back data and flag register 21.

The auto write back is processing executed in the order of steps S33, S34, and S35 shown in FIG. 9 when no error flag is set. An address is automatically set, read is performed, and write back is performed to an address at which an error has been detected.

In this case, since an error flag is set at the time T1, the write back controller 12 writes back corrected data corresponding to the error flag to an address corresponding to the error flag at the time T2 at which the next auto write back command is input.

At the time T2, it is checked whether an error flag is set in the write back data and flag register 21. In this case, since no error flag is set, write back according to an error flag is not performed, and auto write back is executed at the time T3 at which the next auto write back command is input.

At the time T3, it is checked whether an error flag is set in the write back data and flag register 21. In this case, two error flags are set. Hence, the write back controller 12 writes back corrected data corresponding to the error flags to addresses corresponding to the error flags at the time T4 at which the next auto write back command is input.

At the time T4 and the times T5 and T6 at which the next auto write back command is input, it is checked whether an error flag is set in the write back data and flag register 21. In this case, since no error flag is set, write back according to an error flag is not performed, and auto write back is executed at the times at which the next auto write back command is input.

In the third embodiment, error checking and correction of read data is performed at the time of read when a read command is input. If the read data includes an error, an error flag is set, and the address and corrected data are stored. The error flag is checked for every predetermined period. If an error flag is set, the corrected data is written back to the address for which the error flag is set. If no error flag is set, auto write back is performed. That is, read is performed for an address automatically issued by the address counter, and corrected data is written back to the address at which an error has been detected. Data write back is performed not immediately after read by the read command but for every predetermined period.

This can shorten the read cycle time in the read operation. It is also possible to reduce data errors caused by read disturb and write errors. In the third embodiment, since auto write back is performed even if no error flag is set, data errors can further be reduced.

The auto write back operation of an MRAM according to the modification of the third embodiment will be described next. In this modification, an example will be described in which the interval to perform auto write back is changed in accordance with the error flag generation frequency.

Figure 11:
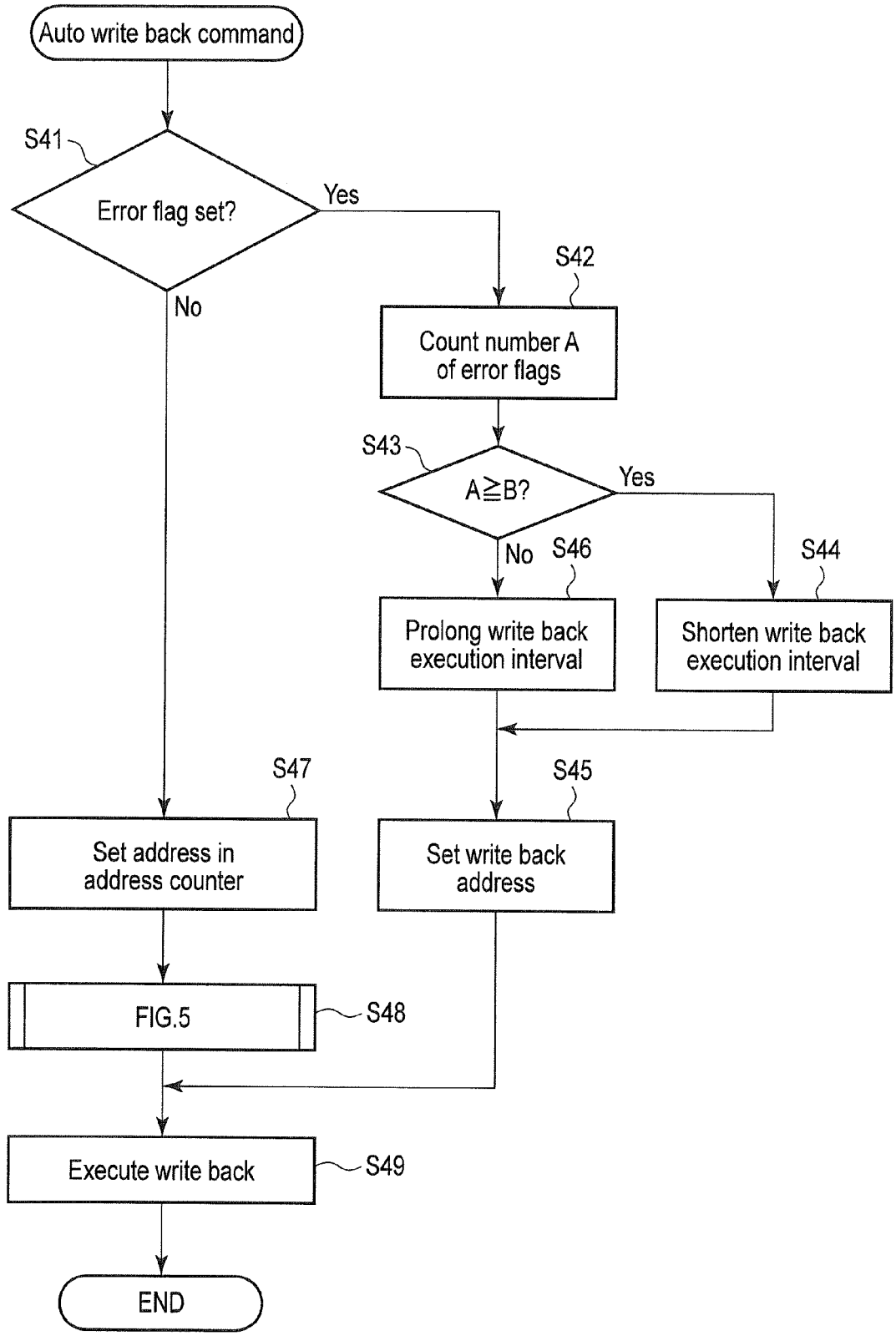
FIG. 11 is a flowchart showing the operation of an auto write back command of an MRAM according to the modification of the third embodiment.

FIG. 11 is a flowchart showing the operation of the auto write back command of the MRAM according to the modification.

When the auto write back command is input to the input/output circuit 19, the command controller 17 performs control necessary for auto write back.

First, the write back check circuit 23 determines whether an error flag is set in the write back data and flag register 21 (step S41). If an error flag is set, the write back check circuit 23 counts the number A of error flags (step S42).

Next, the write back check circuit 23 determines whether the number A of error flags is equal to or larger than a predetermined number B (step S43). If the number A of error flags is equal to or larger than the predetermined number B, the write back controller 12 shortens the interval to perform write back (step S44). After that, the process advances to step S45.

On the other hand, if the number A of error flags is smaller than the predetermined number B in step S43, the write back controller 12 prolongs the interval to perform write back (step S46). After that, the process advances to step S45.

In step S45, the multiplexer 32 outputs the address corresponding to the error flag, which is stored in the write back address register 22, to the address controller 14. After that, write back is executed to the memory cell designated by the address set in the address controller 14 (step S49).

On the other hand, if no error flag is set in step S41, the multiplexer 32 outputs the address stored in the auto write back address counter 31 to the address controller 14 (step S47).

Next, read shown in FIG. 5 is executed for the address set in the address controller 14 (step S48). If the ECC circuit 16 detects an error in the read, the address at which the error has been detected is stored in the write back address register 22. In addition, the address is output from the write back address register 22 to the address controller 14 via the multiplexer 32. Furthermore, write back is executed to the memory cell designated by the address set in the address controller 14 (step S49). The operation of the auto write back command thus ends.

The auto write back operation of the MRAM according to the modification will be described in detail with reference to FIG. 12. FIG. 12 is a timing chart showing the auto write back operation of the MRAM.

As shown in FIG. 12, the auto write back command is input every time a time tWBI1 has elapsed, that is, at each of the times T1 to T6. When the auto write back command is input at the time T1, the write back controller 12 executes auto write back. In addition, the write back check circuit 23 checks whether an error flag is set in the write back data and flag register 21.

In this case, since an error flag is set at the time T1, the write back controller 12 writes back corrected data corresponding to the error flag to an address corresponding to the error flag at the time T2 at which the next auto write back command is input.

At the times T2, T3, T4, and T5, no error flag is set. Hence, write back according to an error flag is not performed, and auto write back is executed at the times T3, T4, T5, and T6 at which the next auto write back command is input.

When the auto write back command is input at the time T6, the write back check circuit 23 checks whether an error flag is set in the write back data and flag register 21.

At the time T6, a plurality of error flags are set. Hence, the write back controller 12 writes back corrected data corresponding to the error flags to addresses corresponding to the error flags at the time T7 at which the next auto write back command is input.

In the error flag check at the time T6, the number A of error flags is equal to or larger than the predetermined number B. For this reason, the auto write back command input interval at the times T7 to T12 is adjusted to be shorter, as shown in FIG. 12. For example, the auto write back command is input at the times T7 to T12 every time a time tWBI2 shorter than the time tWBI1 has elapsed. Even when the error data generation frequency rises, data errors can be reduced by shortening the write back execution interval.

In the modification, the auto write back command input interval is changed in accordance with the error flag generation frequency. That is, when the error flag generation frequency is high, the write back execution interval is shortened. When the error flag generation frequency is low, the write back execution interval is prolonged. This enables an efficient write back operation.

As described above, according to the above-described embodiments, the problem that the rate of data error occurrence caused by read disturb and write errors in the MRAM increases can be solved while maintaining the performance of the memory.

Note that a command generated as an auto refresh command in a dynamic random access memory (DRAM) can also be used as the auto write back command of the embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic random access memory comprising:
a memory cell array in which memory cells each including a magnetoresistive element are arranged;
a read circuit configured to read data from a memory cell designated by an address out of the memory cells;
an error checking and correction (ECC) circuit configured to check an error in the data read by the read circuit and correct the error;
an address register configured to store the address at which the error has been detected by the ECC circuit;
a data register configured to store corrected data in which the error has been corrected by the ECC circuit;
a flag register configured to set an error flag in association with the address at which the error has been detected by the ECC circuit;
a flag check circuit configured to check whether the error flag is set in the flag register; and
a write back circuit configured to write back the data to the memory cell designated by the address corresponding to the error flag.

2. The magnetic random access memory according to claim 1, wherein when the error flag is detected by the flag check circuit, the write back circuit writes back the corrected data to the address corresponding to the error flag, and
when the error flag is not detected by the flag check circuit, the write back circuit stops the write back.

3. The magnetic random access memory according to claim 1, wherein at the time of a read operation,
the read circuit reads the data from the memory cell in the memory cell array,
the ECC circuit checks the error in the data read by the read circuit and corrects the error,
the address register stores the address at which the error has been detected by the ECC circuit,
the data register stores the corrected data in which the error has been corrected by the ECC circuit, and
the flag register sets the error flag in association with the address at which the error has been detected by the ECC circuit.

4. The magnetic random access memory according to claim 1, further comprising:
an address counter configured to generate an address and increment the address; and
a multiplexer configured to select the address stored in one of the address register and the address counter in accordance with an output from the flag check circuit.

5. The magnetic random access memory according to claim 4, wherein when the error flag is detected by the flag check circuit, the write back circuit performs a write back operation,
the write back operation including:
causing the multiplexer to select the address stored in the address register; and
causing the write back circuit to write back the corrected data to the memory cell designated by the address, and
when the error flag is not detected by the flag check circuit, the write back circuit performs an auto write back operation,
the auto write back operation including:
causing the multiplexer to select the address stored in the address counter;
causing the read circuit to read the data from the memory cell designated by the address;
causing the ECC circuit to check the error in the data read by the read circuit and correct the error;
causing the address register to store the address at which the error has been detected by the ECC circuit;
causing the data register to store the corrected data in which the error has been corrected by the ECC circuit;
causing the flag register to set the error flag in association with the address at which the error has been detected by the ECC circuit; and
causing the write back circuit to write back the data to the memory cell designated by the address corresponding to the error flag.

6. The magnetic random access memory according to claim 5, wherein the flag check circuit counts the number of error flags set in the flag register, and
when the number of error flags is not less than a predetermined value, the write back circuit shortens an interval to perform the write back operation, and
when the number of error flags is less than the predetermined value, the write back circuit prolongs the interval to perform the write back.

7. The magnetic random access memory according to claim 1, wherein the magnetoresistive element includes a magnetic tunnel junction (MTJ) element.

* * * * *